United States Patent
Berthold et al.

(10) Patent No.: US 6,361,663 B1
(45) Date of Patent: Mar. 26, 2002

(54) VACUUM ARC EVAPORATOR

(75) Inventors: Jan Berthold; Thomas Witke; Peter Siemroth, all of Dresden (DE)

(73) Assignee: Fraunhofer-Gesellschaft zur Forderung der Angewandten Forschung e.V. (DE)

(*) Notice: Subject to any disclaimer, the term of this patent is extended or adjusted under 35 U.S.C. 154(b) by 0 days.

(21) Appl. No.: 09/574,514

(22) Filed: May 19, 2000

(30) Foreign Application Priority Data

May 21, 1999 (DE) .......................................... 199 24 094

(51) Int. Cl.⁷ .............................................. C23C 14/32
(52) U.S. Cl. .............................. 204/192.38; 204/298.41; 427/580
(58) Field of Search ...................... 204/192.38, 298.41; 427/580

(56) References Cited

U.S. PATENT DOCUMENTS

| | | | |
|---|---|---|---|
| 3,625,848 A | | 12/1971 | Snaper |
| 3,836,451 A | * | 9/1974 | Snaper ................... 204/192.38 |
| 4,201,654 A | * | 5/1980 | Castleman ............ 204/298.06 |
| 4,839,011 A | * | 6/1989 | Ramalingam et al. . 204/192.38 |
| 5,013,578 A | * | 5/1991 | Brown et al. .......... 204/298.41 |
| 5,096,558 A | * | 3/1992 | Ehrich ................... 204/192.38 |
| 5,238,546 A | * | 8/1993 | Bergmann et al. ..... 204/192.38 |
| 5,433,836 A | * | 7/1995 | Martin et al. .......... 204/298.41 |

FOREIGN PATENT DOCUMENTS

| | | |
|---|---|---|
| DE | 30 23 672 | 1/1982 |
| DE | 31 52 736 | 2/1983 |
| DE | 39 01 401 | 9/1989 |
| DE | 40 06 456 | 5/1991 |
| DE | 44 01 986 | 7/1995 |
| EP | 0 489 396 | 6/1992 |
| EP | 0 549 545 | 6/1993 |
| WO | 96/26531 | 8/1996 |
| WO | 97/28672 | 8/1997 |
| WO | 98/45871 | 10/1998 |

* cited by examiner

*Primary Examiner*—Rodney G. McDonald
(74) *Attorney, Agent, or Firm*—Leydig, Voit & Mayer, Ltd.

(57) ABSTRACT

The invention relates to a vacuum arc evaporator with which a wide variety of substrates can be provided with various coatings or to which various systems of layers can be applied. The invention is intended to achieve an improvement in the quality of the layer, with increased material utilization and higher coating rate. A vacuum arc evaporator with a cathode of electrically conducting material and an anode for generating a plasma arranged in an evacuable housing is used for this purpose. The plasma is generated by an evaporation of the cathode material by means of arc discharge. The anode is enclosed by an insulator and is otherwise surrounded by cathode material on all sides.

23 Claims, 5 Drawing Sheets

VACUUM ARC EVAPORATOR

The invention relates to a vacuum arc evaporator with which a wide variety of substrates can be provided with various coatings or to which various systems of layers can be applied. Substrates coated in this way can be used in a wide variety of technical fields. The coatings may influence the mechanical properties of components, bring about certain optical effects and also be used, for example, for forming structures in semiconductor technology.

Vacuum arc discharge has been used for some time as a plasma source for the coating of substrates. In this process, minute particles, known as droplets, are produced along with the plasma. These particles are also contained in the finished layer and have an adverse effect on the quality of the layer. Since the layers produced have thicknesses in the nanometer to micrometer range, the relatively small size of these particles is also often troublesome.

New potential applications are, however, imposing ever greater requirements on the quality of the layer, in particular with respect to the electrical, electronic or optical properties. Reference should be made here, inter alia, particularly to the efforts being made in semiconductor technology to achieve miniaturization in the nanometer range.

Since the formation of the particles with rising arc current decreases at an increased rate of movement of the arc spot on the cathode surface, it is endeavored to work in this range. This presents problems, however, since the movement of the arc spot is difficult to control. This has so far been alleviated by operating the arc discharge in a pulsed manner, i.e. extinguishing an ignited arc by lowering the arc current before the bottom point of the arc has moved over the edge of the cathode and then reigniting it in a pulsed manner (cf. DD 280 338).

To at least hinder the embedding of such relatively large-sized particles in such layers and reduce their number, diaphragms serving at the same time as the anode or plasma filters have so far been used, being intended to prevent these particles from reaching the substrate by means of strong magnetic fields.

The magnetic fields used serve the purpose of separating the charged plasma constituents from the neutral particles by using for this purpose a curved path in the direction of the substrate and by the neutral particles not following the curved path.

Since the magnetic fields used influence the arc current, there are design limits to this principle, with the result that losses of coating material due to undesired deposition on the chamber wall, and consequently reduced coating rates, cannot be avoided.

It is therefore the object of the invention to improve vacuum arc evaporators to the extent that an improvement in the quality of the layer can be achieved, with increased material utilization and a higher coating rate.

This object preferably is achieved according to the invention. Advantageous embodiments and developments of the invention will be apparent from the description of the invention provided herein.

The vacuum arc evaporator according to the invention uses the customary elements of a cathode and anode in an evacuable housing. In this case, however, the anode is arranged in such a way that it is surrounded on all sides by the cathode, which consists of an electrically conducting material which is evaporated for forming the coating of a substrate. It goes without saying that the anode is electrically insulated from the cathode, for which purpose it is enclosed by an insulating sleeve, for example of ceramic.

The cathode may be designed in the form of a circular rings at the center of which the anode is arranged. The cathode surface may be planar but also concavely or convexly curved.

The anode may be designed in the form of a rod and protrude with its tip, pointing in the direction of the substrate to be coated, above the surface of the cathode.

The plasma generated as a result of the arc discharge passes to a-substrate, which may be provided with a layer or a system of layers. The layer may be formed from the cathode material, for example a metal or an alloy, or reactively by means of supplied gas as a compound of a metal (nitrides, oxides).

The formation of a system of layers with individual layers of different materials, which may be applied alternately, can also be produced.

For this purpose, it is possible to use a segmented cathode, in which various materials are locally separate from one another. For instance, various alloys may also be deposited in one layer or, for example, reactively carbidic layers may be obtained if one segment of the cathode consists of carbon and another segment consists of a carbide-forming metal.

The vacuum arc evaporator according to the invention may also be operated with a plasma filter, the arrangement of the anode according to the invention having advantageous effects on the concentration of the plasma brought about by the magnetic field used.

The reduced influence of the magnetic field on the plasma and the arc current allows a smaller distance between the magnetic field and the cathode to be maintained.

For igniting the arc discharge there may be at least one igniting device, which may be arranged on the cathode at a distance from the anode. In particular in the case of a segmented cathode, there may be a plurality of igniting devices. In any event, however, a plurality of igniting devices should be arranged symmetrically with respect to one other and with respect to the anode.

A segmented cathode with its various segments may for example be in the form of a figure eight or a clover leaf. The size of the surface of the individual segments does not have to be the same, but instead may vary in dependence on the material-specific rate of movement of the cathode spots or the amount of material to be removed. If, for example, two different materials are to be removed in a certain ratio from various segments for forming a coating, the sum of the pulse durations for the vacuum arc discharge on the respective segments can be chosen in the same ratio.

The various segments may also respectively have an anode assigned to them, so that the arc discharge can be ignited or influenced separately for each segment and the composition of the layer deposited can also be influenced accordingly.

The design according to the invention has advantageous effects in conjunction with an externally applied magnetic field, as a plasma filter. The self-magnetic field of the arc current, the current flow to the anode and the external magnetic field bring about a greater concentration of the plasma, which leads to more effective use of the evaporated material and to an increase in the coating rate. External magnetic fields for guiding the plasma to the substrate may act up to the direct vicinity of the anode or cathode, without disturbing the burning behavior of the arc discharge.

If power circuit breakers with short switching times are used in the arc circuit, short circuits which occur as a result of undesired coatings on the insulation between the anode and the cathode can be easily removed by brief current pulses.

A vacuum arc evaporator according to the invention can be operated with a continuous arc current. In this case, an external magnetic field can guide the vacuum arc with its bottom point in an annular form on the surface of the cathode and prevent the arc from moving toward the anode and remaining there at one point, close to the anode. The ignition of the arc discharge may take place, for example, at the edge of the cathode by means of sliding discharge or contact ignition.

Pulsed operation with a pulsed arc current is also possible, however, as known from DD 280 338, although there the anode is in the form of a diaphragm. By contrast with this, the arc is ignited off-center with a correspondingly arranged igniting electrode, as the igniting device, by a sliding spark discharge between the igniting electrode and the cathode. In the case of a high arc current of I>1 kA, a plurality of cathode spots are formed. The spots form around the anode and run radially outward. The arc current is reduced or switched off entirely before the spots reach the outer edge of the cathode.

Without an igniting electrode, a sliding discharge between the anode and the cathode can likewise lead to the ignition of the vacuum arc.

In the case of a pulsed arc current, the ignition of a vacuum arc can also be initiated by a gas discharge. In this way as well, the ignition should take place off-center, with the aid of a gas supply through the cathode correspondingly arranged there. The pressure stages in the gasp flow may be set such that the gas discharge takes place on the cathode surface between an igniting electrode and the cathode, for which purpose an adequately high negative voltage is applied for a short time.

The ignition may also take place, however, by means of a gas discharge, without an igniting electrode, with a pulsed arc current between the anode and the cathode if an adequately high negative voltage is applied for a short time between the anode and the cathode, the voltage being adequate to ionize the gas.

The ignition may also take place with a pulsed energy beam (for example an electron beam or a laser beam), a plasma being generated locally by the beam focused on the surface of the cathode, for igniting the arc plasma.

It is also possible, however, to work exclusively with a modulated arc current. During the arc discharge, the arc current is kept above 1 kA. After the discharge or when the bottom point of the arc has reached at least the vicinity of the edge of the cathode, the arc current is reduced to a value below 100 A, so that at least one arc spot exists. Under these conditions, the spot runs in the direction of the anode. If the spot reaches the vicinity of the insulation of the anode, a new discharge pulse takes place by increasing the arc current and a plurality of spots are formed, which again run radially to the outer edge of the cathode. After igniting once, this process can be repeated as often as required to form the desired layer. The ignition may take place at the edge of the cathode by means of a sliding discharge or by means of contact ignition with an igniting electrode which can be placed onto the cathode. The arc current modulation may be carried out from a basic current of about 100 A by super-posing a current in pulse form. The total amplitude during a pulse may be up to 5000 A.

The invention is to be explained below by way of example.

Figure 5:
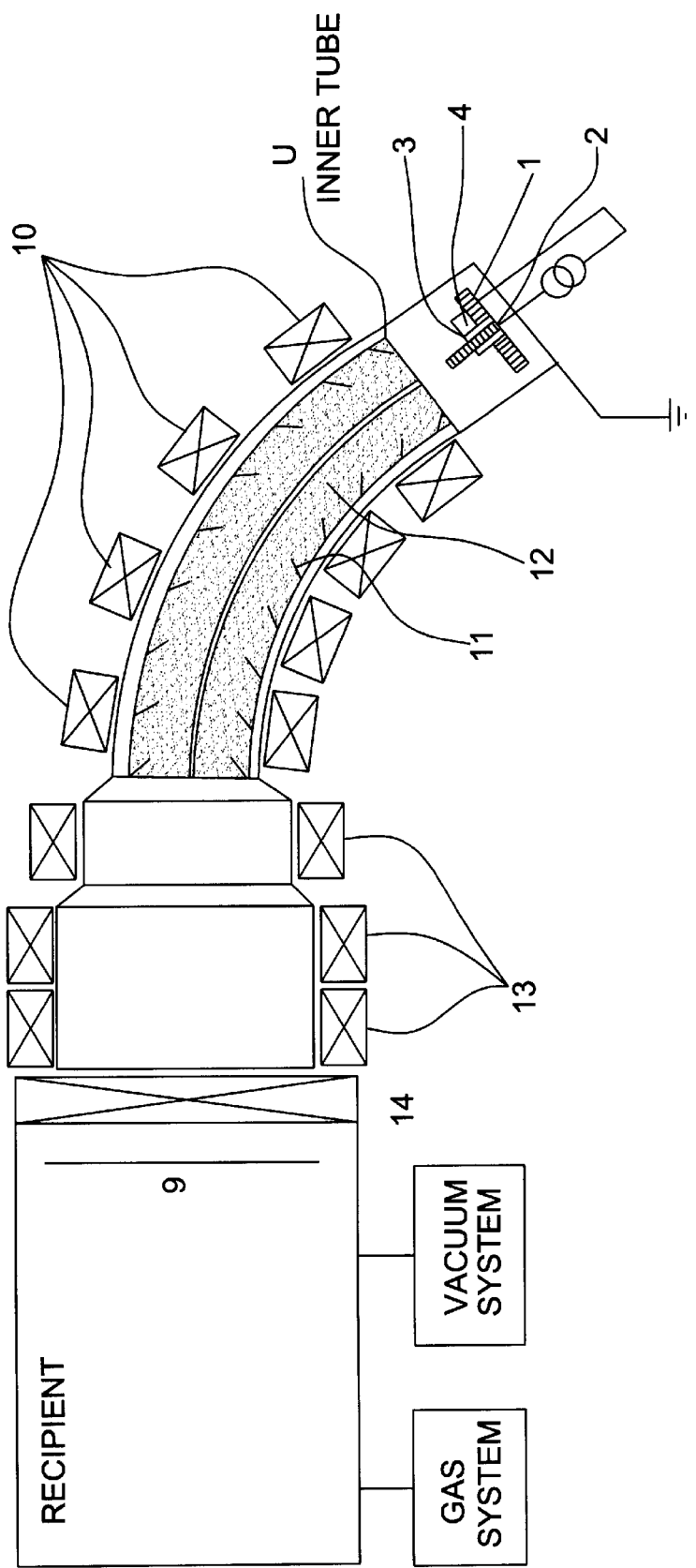

FIGS. 4(a)–(d) show examples of configurations and arrangements of cathodes, anodes and igniting devices;

FIG. 5 shows a schematic representation of an example of a vacuum arc evaporator according to the invention with a plasma filter.

Figure 1:
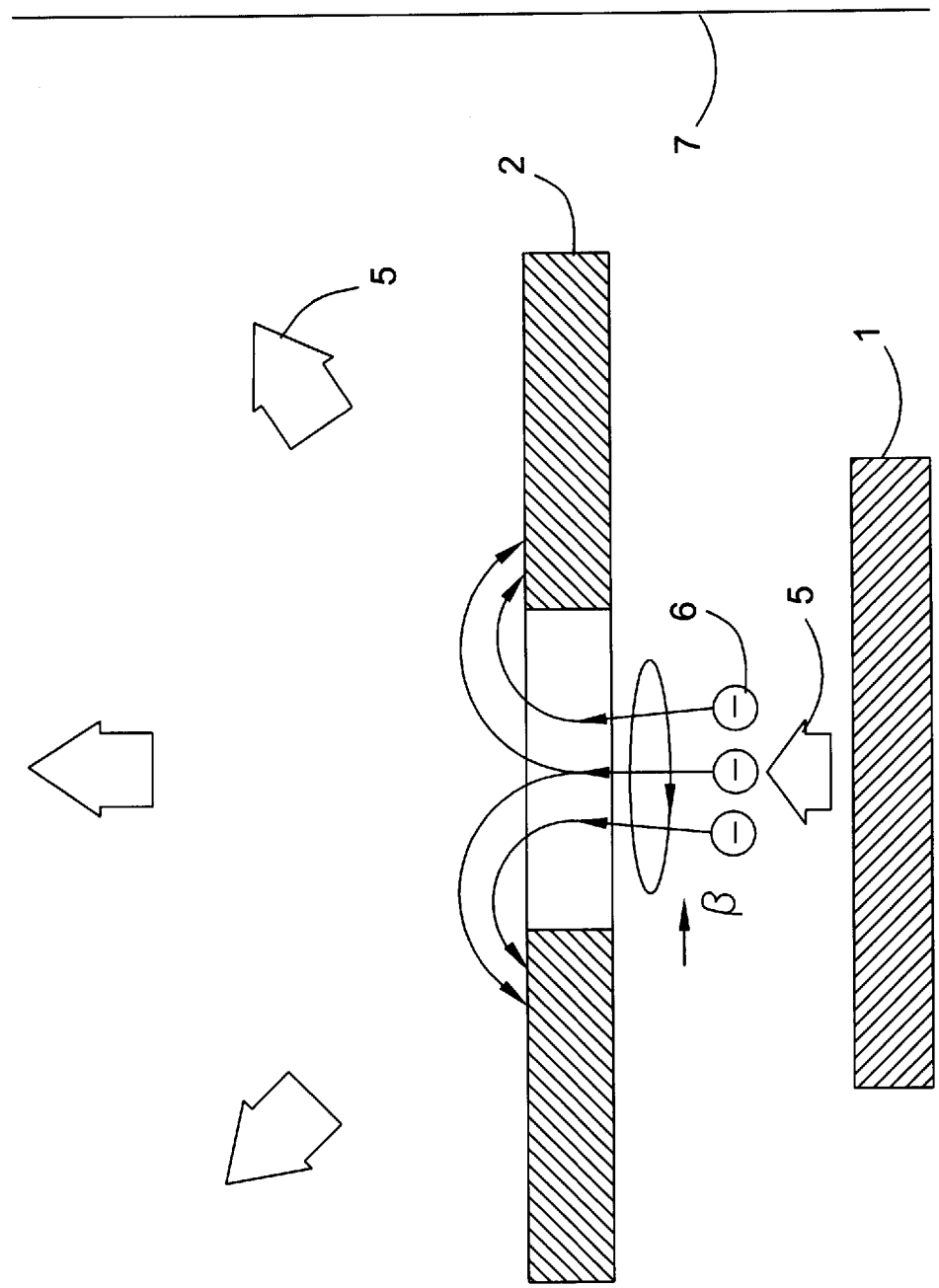
FIG. 1 shows a vacuum arc evaporator with an anode in the form of a diaphragm, according to the prior art.

In the example of a conventional vacuum arc evaporator shown in FIG. 1, an anode 2 in the form of a diaphragm is used, with a central perforation through which the plasma generated by a vacuum arc discharge can pass in the direction of a substrate (not represented here). Arranged beneath the anode 2 is the cathode 1. The arc current 6 leaves the cathode 1 and flows to the anode 2,. As a result, the cathode 1 is eroded and an expanding plasma flow 5 is formed. The self-magnetic field of the arc current 6 reaches about 20 mT at $I_{arc}$=1 kA. It exerts a force on the arc current and on the charged particles of the plasma. The electrons of the plasma are accelerated toward the center of the plasma flow. The plasma flow 5 straightens and moves from the cathode to the anode. The concentration of the plasma is further intensified in this way, since the arc current at the center of the plasma flow 5 leads to further heating up of the plasma and a corresponding increase in its conductivity.

When the plasma flow 5 passes through the perforation in the anode 2, the concentration of the plasma flow 5 is lost and the plasma expands spatially as it becomes more diffuse. This dissipation of the concentration is caused by the arc current, which at the latest after the anode 2 flows laterally away. The transformation into diffuse plasma takes place as a result of collision processes and electromagnetic interaction in the plasma. It has been found that approximately 50% of copper evaporated from a cathode is deposited on the inside wall 7 of a housing, which is certainly undesired for the coating of various substrates. What is more, an inside wall coated in this way must generally be laboriously cleaned again.

The plasma formation and the plasma flow around the cathode or the chamber wall also change, in the way described, if toroidal or tubular anodes are used.

Figure 2:
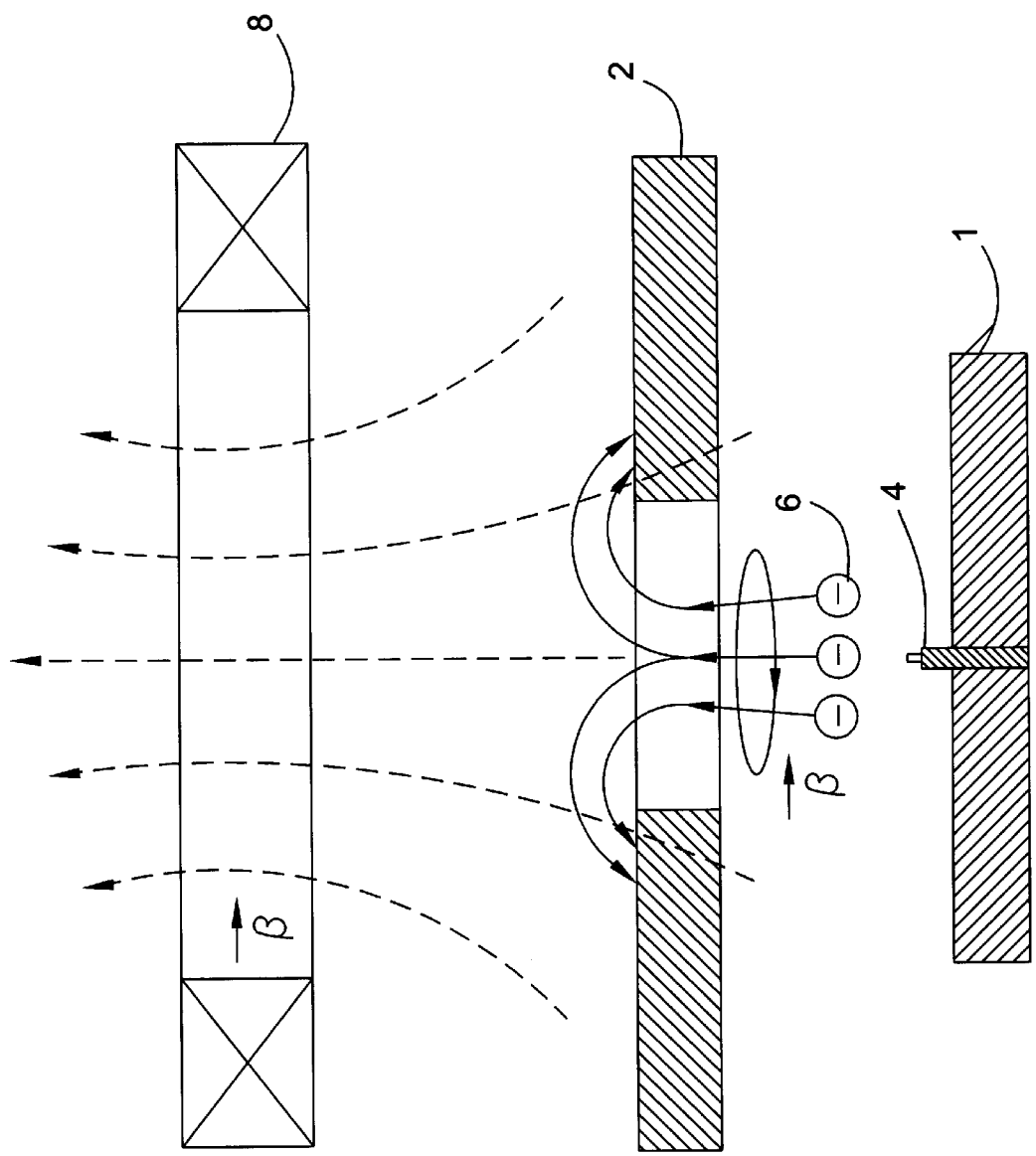
FIG. 2 shows a vacuum arc evaporator with an anode in the form of a diaphragm and an additional external magnetic field, as a plasma filter according to the prior art.

The conventional vacuum arc evaporator shown in FIG. 2 differs from the embodiment according to FIG. 1 by the igniting electrode 4 arranged on the cathode 1 and, in particular, by an external magnetic field 8 (plasma filter), which is formed downstream of the anode 2 before a substrate (not represented), through which the plasma flow is guided.

In this case, with known anode designs a concentration of the plasma flow does indeed occur in conjunction with such a plasma filter, since the charged plasma particles move in spiral paths along the magnetic field lines. As a result, the electrical resistance of the plasma is increased orthogonally with respect to the field lines. Since, however, the arc current must also flow in this direction when it flows to the anode, a minimum distance must be maintained between the magnetic field 8, anode 2 and cathode 1, to prevent the burning behavior of the vacuum arc being disturbed by the increased electrical resistance of the plasma between the cathode 1 and the anode 2.

These problems can be readily overcome in a simple way by the novel design and arrangement of an anode in a vacuum arc evaporator.

Figure 3:
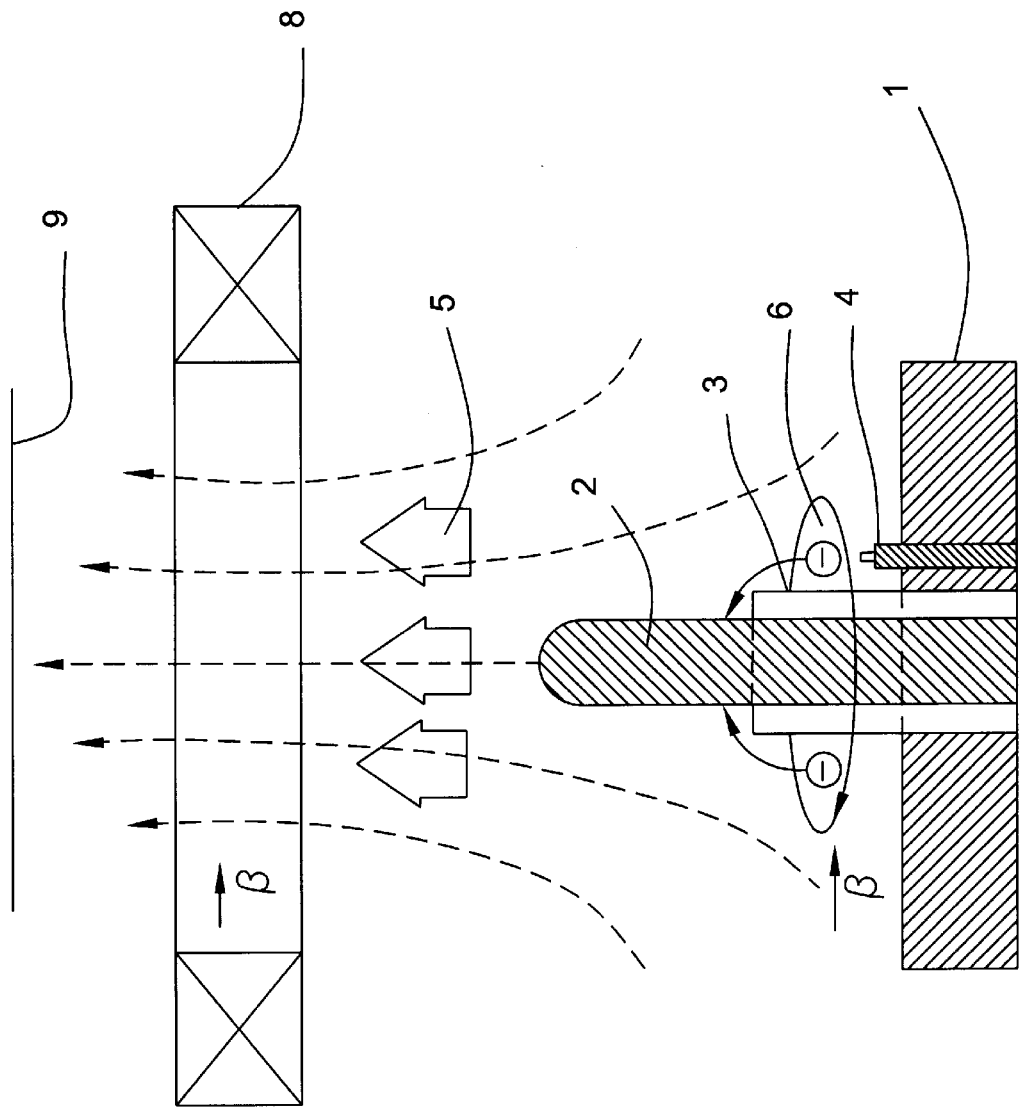
FIG. 3 shows a schematic representation of an example of a vacuum arc evaporator according to the invention.

One possible embodiment is represented in FIG. 3. Used here is an anode 2 in the form of a rod, which is arranged centrally in the cathode 1 and is insulated with respect to the electrically conducting material of the cathode 1 by an insulating sleeve 3 of a high-impedance ceramic material.

For igniting the vacuum arc, here there is an igniting electrode, arranged at a distance from the anode 2, as the igniting device 4. The plasma produced as a result of the arc discharge is guided as a plasma flow by an external magnetic field 8 to the substrate 9. In this case, the achievable concentration of the plasma flow with the magnetic field 8 has advantageous effects and any influencing of the arc discharge by the magnetic field 8 can to the greatest extent be ignored.

The ignition and the arc discharge may take place or be influenced in various ways, as have been mentioned in the general part of the description.

In this example, the cathode 1 and anode 2 consist of copper and are water-cooled. The diameter of the cathode 1 is 100 mm, that of the anode 2 is 15 mm and the outside diameter of the insulating sleeve 3 (of BN) is 22 mm. The insulating sleeve 3 protrudes 20 mm above the surface of the cathode. The anode 2 protrudes above the surface of the cathode by 60 mm, so that it has a region which lies 40 mm above the insulating sleeve 3. The tip of the anode is rounded off.

The igniting electrode 4 is arranged 18 mm from the center of the cathode 1 and protrudes 3 mm above the surface of the latter.

If the vacuum arc evaporator is operated without an external magnetic field 8, but otherwise, as shown in FIG. 3, with a pulsed arc current, the arc current reaches 3 kA during a discharge. After ignition of the arc by means of a sliding discharge, about 50 macroscopically visible erosion centers (arc spots) are produced around the anode 2, moving radially outward at a rate of about 15 m/s. After 1 ms, the current discharge is ended by reducing the applied arc current and the operation is repeated with a renewed ignition. Arc discharges can be initiated at a frequency of 50 Hz. After 1000 discharges, a layer of copper with a thickness of 250 nm and a diameter of 250 mm has been deposited on the substrate 9, which is arranged at a distance of 500 mm. About 60% of the copper evaporated can be utilized as layer material, which corresponds approximately to three times the conventional vacuum arc evaporators with an anode 2 in the form of a diaphragm. The number of particles can be reduced to a tenth of such vacuum arc evaporators operated with a direct current of 100 A.

If operated in an atmosphere with an oxygen partial pressure of between 0.5 and 1 Pa, a non-transparent copper oxide layer is formed instead of the copper layer.

If, as shown in FIG. 3, an additional external magnetic field 8 is used as a plasma filter, the guidance of the plasma flow 5 to the substrate 9 can be further improved. For generating the magnetic field it is possible to operate a coil with a field strength of 30 mT in the coil and a field strength of 10 mT at the upper region of the anode 2. A coating with a diameter of 180 mm and a layer thickness of 470 nm has been achieved in this way. The number of particles in the layer can be further reduced, since a greater concentration of the plasma flow can be achieved, and at the same time the particles retain their emission characteristics.

Figure 4A:
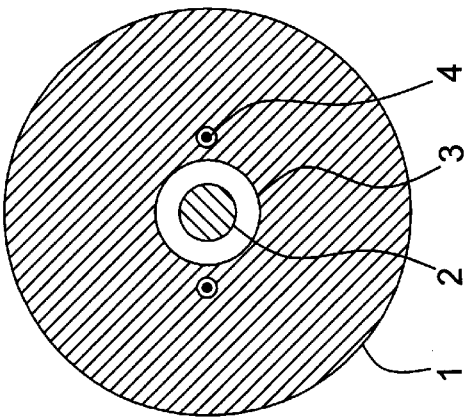

Various forms of cathode are represented in FIGS. 4a to 4d. FIG. 4a shows a plan view of a cathode 1, as also used in the example according to FIG. 3.

Figure 4B:
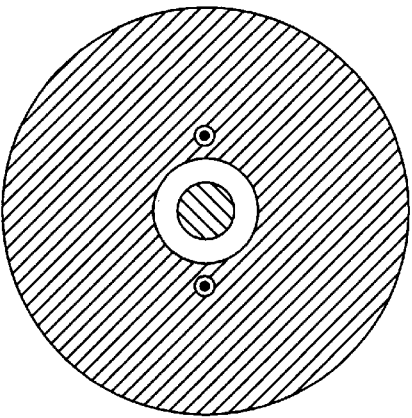

FIG. 4b reveals two igniting devices 4, which are arranged symmetrically and diametrically opposite at a distance from the anode 2.

Figure 4C:
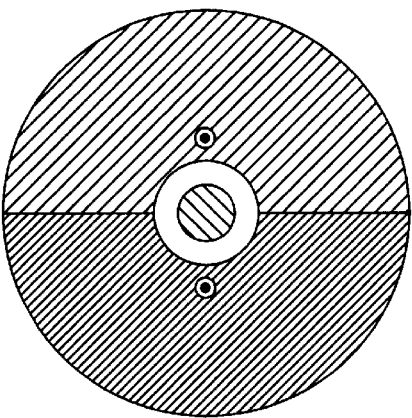

In the case of the cathode 1 according to FIG. 4c there are two half-circles of the same size, of different materials, forming segments. In this case there is an igniting device 4 on each of the two segments, so that for example a layer of carbide can be obtained if one of the segments of the cathode 1 consists of carbon.

Figure 4D:
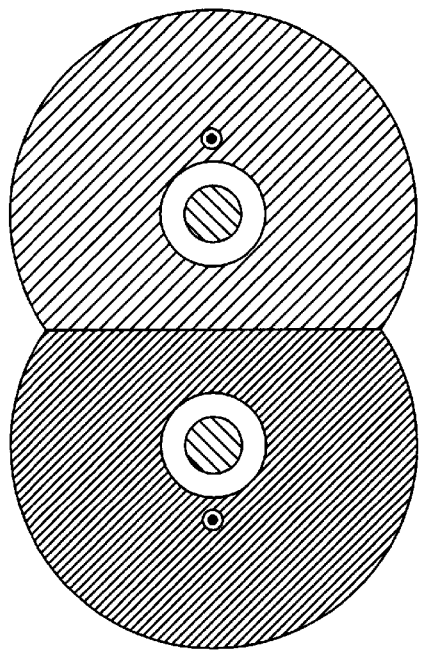

A cathode 1 designed in the form of a figure eight, again with two segments, consisting of different materials, is represented in FIG. 4d. Here, a separate anode 2, with an igniting device 4 of its own in each case, is shown on each of the segments. As a result, a multilayer structure can be formed on a substrate by correspondingly influencing the two devices, in that coating is respectively performed with each segment of the cathode 1 in an alternating manner.

In the case of the example shown in FIG. 5, a plasma filter is likewise additionally integrated. In this case, the plasma filter was flange-mounted onto an evacuable housing and a plate valve 14 interposed. The plasma filter is of a curved design, the curvature having an angle of 60° and the plasma flow being guided in the direction of a substrate 9. In this way, particles which remain in the plasma filter can be prevented from falling into the housing or onto the substrate 9.

Arranged inside the coils 10, which generate the external magnetic field of the plasma filter, is an inner tube 12, likewise of a curved design. In the inner tube 12 there are additional fins 11, which are angled counter to the direction of movement of the plasma flow. The inner tube 12 is electrically insulated with respect to the chamber wall. These fins 11 allow reflected particles to be prevented from reaching the substrate 9 or from getting into the housing.

A closed one-part inner tube 12, which is connected to a voltage potential of $U_{inner\ tube}$=15 V, can increase the filter transmission by a factor of 1.3.

Represented in FIG. 5, however, is a two-part inner tube 12, which is formed by two half-shells. The inner half-shell in the direction of curvature, with the smaller radius, may be grounded to frame potential and the outer half-shell, with the greater radius, may be subjected to pulsed voltage or connected to a voltage of 15 V. With this half-shell construction, the filter transmission can be increased once again by a factor of 1.3.

Following the inner tube 12, in this example the free inside diameter through which the plasma flow is guided to the substrate 9 is enlarged. Starting from 150 mm (inside diameter of the fins 11), this may take place in stages over 280 mm to 360 mm, an external magnetic field generated by coils 13 also acting in this region. This widening of the diameter ensures that the plasma flow is homogenized and that the substrate is coated uniformly over a diameter of 300 mm. The coils 13 further support the homogenization.

The coils 13 ensure a magnetic field strength of 75 mT. All the coils 10, 13 are water-cooled. Operation of the coils 13 with opposite polarity is also possible.

The coils arranged in the curved region are operated and designed in such a way that a magnetic field with a field strength of 100 mT is generated.

In this way it is possible, for example, for particle-free layers of copper, as are desired for example in semiconductor technology, to be deposited. The transmittance of such a filter arrangement is around 50%, so that a particle-free layer of copper with a thickness of 90 nm can be obtained by 1000 discharges.

For depositing reactively formed layers, along with the vacuum system there may also be a gas supply system, for nitrogen or oxygen for example, on the housing.

What is more, the anode 2, as shown in FIG. 5, may be grounded and shorted with the housing. In this way, the burning behavior of the vacuum arc can be favorably influenced directly after ignition.

What is claimed is:

1. A vacuum arc evaporator comprising a cathode of electrically conducting material and an anode for generating a plasma, as a result of cathode material evaporation by means of arc discharge, arranged in an evacuable housing, wherein at least one anode enclosed by an insulating sleeve is arranged in such a way that it is surrounded by cathode material on all sides, wherein the plasma generated is guided through a magnetic field as a plasma filter to the substrate, and wherein an inner tube is arranged inside the plasma filter.

2. The vacuum arc evaporator as claimed in claim 1, wherein the cathode includes a center, and wherein the anode is arranged at the center of the cathode.

3. The vacuum arc evaporator as claimed in claim 1, wherein the anode is designed in the form of a rod and protrudes above the surface of the cathode in the direction of a substrate to be coated.

4. The vacuum arc evaporator as claimed in claim 1, wherein the insulating sleeve consists of a ceramic.

5. The vacuum arc evaporator as claimed in claim 1, wherein at least one igniting device is arranged on the cathode at a distance from the anode.

6. The vacuum arc evaporator as claimed in claim 1, wherein a plurality of igniting devices are arranged on the cathode symmetrically with respect to the anode.

7. The vacuum arc evaporator as claimed in claim 1, wherein the cathode comprises at least two segments and the segments respectively consist of different material.

8. The vacuum arc evaporator as claimed in claim 7, wherein the size of the individual segments of the cathode is chosen in dependence on the material-dependent rate of movement of a cathode spot.

9. The vacuum arc evaporator as claimed in claim 7, wherein there is a separate igniting device for each segment of the cathode.

10. The vacuum arc evaporator as claimed in claim 7, wherein there is a separate anode for each segment of the cathode.

11. The vacuum arc evaporator as claimed in claim 1, wherein fins angled counter to the direction of movement of the plasma are arranged inside the inner tube.

12. The vacuum arc evaporator as claimed in claim 1, wherein the inner tube is divided into two.

13. The vacuum arc evaporator as claimed in claim 1, wherein the magnetic field and the inner tube are aligned in a curved form.

14. A process for coating substrates with a vacuum arc evaporator as claimed in claim 1, wherein the arc discharge is initiated by means of sliding discharge or contact ignition.

15. The process as claimed in claim 14, wherein a continuous arc current is used and the arc discharge is guided in an annular form on the cathode surface by means of an external magnetic field.

16. A process for coating substrates with a vacuum arc evaporator as claimed in claim 1, wherein the arc discharge is operated in a pulsed manner by sliding spark discharge between the igniting device and the cathode.

17. A process for coating substrates with a vacuum arc evaporator as claimed in claim 1, wherein the arc discharge is operated in a pulsed manner by sliding discharge between the anode and the cathode.

18. A process for coating substrates with a vacuum arc evaporator as claimed in claim 1, wherein the arc discharge is operated in a pulsed manner by gas discharge between the igniting device or the anode and the cathode.

19. A process for coating substrates with a vacuum arc evaporator as claimed in claim 1, wherein the arc discharge is initiated by means of pulsed energy radiation directed at the cathode surface.

20. A process for coating substrates with a vacuum arc evaporator as claimed in claim 1, wherein the arc discharge is operated with a modulated arc current.

21. A vacuum arc evaporator comprising a cathode of electrically conducting material and an anode for generating a plasma, as a result of cathode material evaporation by means of arc discharge, arranged in an evacuable housing, wherein at least one anode enclosed by an insulating sleeve is arranged in such a way that it is surrounded by cathode material on all sides, and wherein a plurality of igniting devices are arranged on the cathode symmetrically with respect to the anode.

22. A vacuum arc evaporator comprising a cathode of electrically conducting material and an anode for generating a plasma, as a result of cathode material evaporation by means of arc discharge, arranged in an evacuable housing, wherein at least one anode enclosed by an insulating sleeve is arranged in such a way that it is surrounded by cathode material on all sides, wherein the cathode comprises at least two segments and the segments respectively consist of different material, and wherein there is a separate igniting device for each segment of the cathode.

23. A vacuum arc evaporator comprising a cathode of electrically conducting material and an anode for generating a plasma, as a result of cathode material evaporation by means of arc discharge, arranged in an evacuable housing, wherein at least two anodes enclosed by insulating sleeves are arranged in such a way that they are surrounded by cathode material on all sides, wherein the cathode comprises at least two segments and the segments respectively consist of different material, and wherein there is a separate anode for each segment of the cathode.

\* \* \* \* \*